(12) United States Patent
Audette et al.

(10) Patent No.: US 8,002,025 B2
(45) Date of Patent: Aug. 23, 2011

(54) CONTAINMENT OF A WAFER-CHUCK THERMAL INTERFACE FLUID

(75) Inventors: David M. Audette, Colchester, VT (US); Philip J. Diesing, Essex Junction, VT (US); David L. Gardell, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 1517 days.

(21) Appl. No.: 11/380,763

(22) Filed: Apr. 28, 2006

(65) Prior Publication Data

US 2007/0252610 A1 Nov. 1, 2007

(51) Int. Cl.
*F28F 27/00* (2006.01)
*G05D 23/00* (2006.01)

(52) U.S. Cl. ... 165/281; 165/278; 165/296; 165/104.19; 165/104.33; 62/259.2; 34/404

(58) Field of Classification Search ................. 165/80.4, 165/104.33, 206, 281, 296, 104.19, 278; 62/259.2; 34/404
See application file for complete search history.

(56) References Cited

U.S. PATENT DOCUMENTS

| | | | | |
|---|---|---|---|---|
| 4,865,123 | A * | 9/1989 | Kawashima et al. | 165/104.33 |
| 5,084,671 | A * | 1/1992 | Miyata et al. | 165/80.4 |
| 5,426,865 | A * | 6/1995 | Ikeda et al. | 34/404 |
| 5,577,552 | A * | 11/1996 | Ebinuma et al. | 165/296 |
| 5,785,741 | A * | 7/1998 | Li et al. | 96/4 |
| 5,846,375 | A * | 12/1998 | Gilchrist et al. | 165/80.4 |
| 6,102,113 | A * | 8/2000 | Cowans | 165/206 |
| 6,263,587 | B1 * | 7/2001 | Raaijmakers et al. | 34/404 |
| 6,705,095 | B2 * | 3/2004 | Thompson et al. | 62/259.2 |
| 6,810,298 | B2 * | 10/2004 | Emoto | 165/206 |
| 6,866,094 | B2 * | 3/2005 | Cousineau et al. | 165/278 |
| 7,000,416 | B2 * | 2/2006 | Hirooka et al. | 165/104.19 |
| 2002/0121105 | A1 * | 9/2002 | McCarthy et al. | 62/500 |

* cited by examiner

*Primary Examiner* — Ljiljana (Lil) V Ciric
(74) *Attorney, Agent, or Firm* — Michael Le Strange; Roberts Mlotkowski Safran & Cole, P.C.

(57) ABSTRACT

A method includes circulating a heat transferring fluid in a substantially closed system including an interstice between a wafer and a chuck at a first pressure. The method further includes pumping the fluid out of the interstice and increasing the pressure of the fluid to a second pressure. The method further includes reducing the pressure of the fluid to the first pressure and returning the fluid to the interstice. In the system, the fluid in the interstice transfers heat from the wafer to the chuck, or vice versa, by conduction. The presence of a conducting fluid in the interstice thereby decreases the resistivity of the interface, and enables more efficient heat transfer from the wafer to the chuck.

25 Claims, 1 Drawing Sheet

CONTAINMENT OF A WAFER-CHUCK THERMAL INTERFACE FLUID

FIELD OF THE INVENTION

The invention relates to the fabrication of integrated circuits, and more specifically, to a method and device for containment of a fluid in a thermal interface system for use during testing and burn-in of integrated circuits.

BACKGROUND DESCRIPTION

Due to the high costs associated with manufacturing integrated circuits (ICs), manufacturers typically perform testing at the wafer level, before further processing and packaging, and more importantly, before a customer becomes dissatisfied. A typical conventional testing method is as follows. A wafer is mounted on a chuck and held in place through suction. Probes are brought into contact with the circuit devices on the side of the wafer opposite to the chuck. The circuits are tested, sometimes at high power levels (on the order of several hundred watts per square centimeter), for functionality, power integrity, reliability and speed.

High power levels during testing will cause the devices to overheat which may result in inaccurate test results or damage to the device or probes. As the temperature increases, the device may tend to draw even more current, which results in further temperature increase, also known as thermal runaway.

Commonly, the chuck is configured to act as a heater or heat sink, being composed of copper, and having channels or a manifold to carry a temperature-regulating fluid. Effectively, the fluid regulates the temperature of the chuck, and the chuck regulates the temperature of the wafer. Chucks may have heating or thermoelectric elements to further control the temperature.

However, as the power of the device increases, the device temperature will increase above the chuck temperature due to the thermal interface resistance between the device and chuck. Improvements to the chuck to reduce the thermal interface resistance have been attempted, such as optimizing the surface finish, hardness and thermal conductivity of the chuck or the introduction of a high conductivity gas (helium) between the wafer and the chuck.

Further improvements to the interface resistance have been attempted by introducing a thermal interface fluid between the wafer and chuck at atmospheric pressure and simultaneously drawing the fluid away by vacuum. Use of water or aqueous solutions as a thermal interface fluid is advantageous due to its high thermal conductivity. Disadvantages of water are the potential for corrosion or electrical shorts if there is a leak. Various dielectric fluids are advantageous because thermal conductivity is higher than helium, there is minimal risk of corrosion or electrical shorts and any small amount of liquid left on the wafer evaporates without leaving a residue.

Such methods are unfavorable, though. First, because the wafer is held on to the chuck by suction, and the thermal interface fluid is drawn away from the interface at reduced pressure, such a fluid will often vaporize at reduced pressure, reducing the efficiency of the vacuum, and frequently escaping from the system during use. Even if the fluid is cooled after being drawn away from the interface, in order to condense the vapor back into a liquid, a substantial amount of vapor may still be exhausted. The preferred dielectric thermal interface fluids, which readily evaporate and leave little residue, typically have a low vapor pressure and are both expensive and not environmentally friendly. Therefore, any such exhaust is to be avoided.

Second, such a system is necessarily so complex that it is not only initially costly, but also expensive to maintain and prone to failure. Third, the thermal conductivity of a vapor is lower than that of a liquid. Therefore, the more the fluid at the interface is composed of a vapor (and the less of a liquid), the worse the performance of the fluid as a thermal interface.

SUMMARY OF THE INVENTION

In a first aspect of the invention, a method comprises circulating a heat transferring fluid in a substantially closed system including an interstice between a wafer and a chuck at a first pressure. The method further comprises pumping the fluid out of the interstice and increasing the pressure of the fluid to a second pressure. The method further comprises reducing the pressure of the fluid to the first pressure and returning the fluid to the interstice.

In another aspect of the invention, a method of containing a heat transferring fluid for regulating a temperature of a device under test comprises conducting heat between a device under test and a device holder via a fluid circulating at a lower pressure. The method further comprises pressurizing the fluid such that any fluid vapor is condensed into a liquid, and containing the fluid in a substantially closed-loop system.

In another aspect of the invention, a device comprises a chuck having one or more outlets, each outlet connected to a return line, and a pump in fluid communication with the return line to increase a pressure of a circulating fluid from a first pressure within the one or more outlets to a to a second pressure downstream from the pump. The device further comprises a supply line downstream of the pump to reduce the pressure of the fluid to substantially the first pressure, and an inlet in the chuck leading from the supply line to deliver the fluid into an interstice at substantially the first pressure.

DETAILED DESCRIPTION OF EMBODIMENTS OF THE INVENTION

Figure 1:
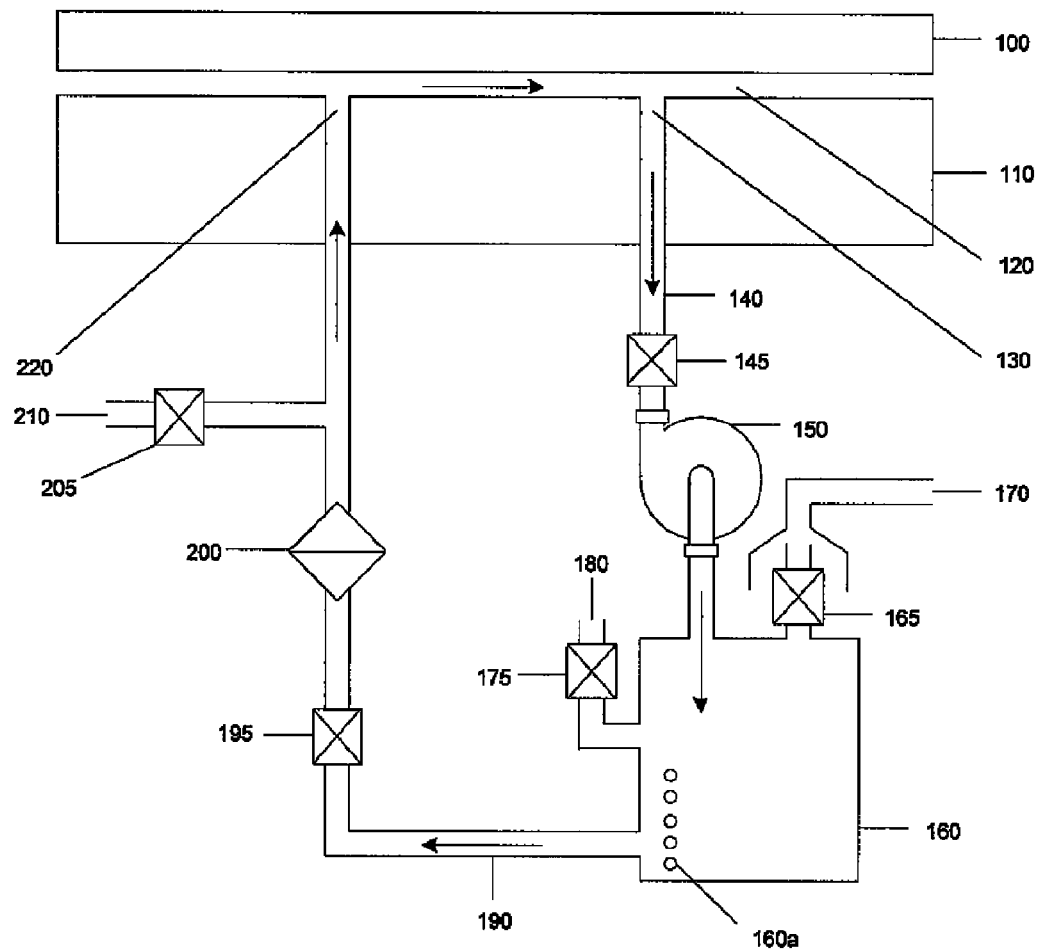
FIG. 1 is a schematic representation (not to scale) of one embodiment of the present invention.

The present invention is generally directed to containment of a fluid in a thermal interface system for use during testing and burn-in of integrated circuits. The device and method of the present invention comprise a substantially closed system that circulates a contained fluid. This is more cost effective than existing solutions in that virtually no fluid escapes the system, and in that the system itself is not complex. The simplicity of the system further enables its reliability; and the improved containment of the fluid makes its use more environmentally sound than existing solutions. The present invention will be useful in situations in which the device power is high resulting in a large temperature difference between the chuck and the wafer and will also be useful in situations in which the device power is relatively low but in which the temperature must be very accurately controlled.

Referring to FIG. 1, a device is shown by which a fluid may be contained during use as a temperature regulator. As shown in FIG. 1, a wafer 100 is mounted on a chuck 110 such that it may be tested or subjected to burn-in. Although the wafer 100 and chuck 110 may be in physical contact, there remains an interstice 120 between the two. In the system of the present invention, a fluid is introduced into the interstice 120 such that the fluid transfers heat from the wafer 100 to the chuck 110, or vice versa, by conduction. The presence of a conducting fluid in the interstice 120 thereby decreases the resistivity of the interface, and enables more efficient heat transfer from the wafer 100 to the chuck 120.

While in the interstice 120, the fluid is at a pressure lower than that of the atmosphere surrounding the wafer 100 and chuck 110. Depending upon the circumstances, including the pressure and the temperature, various well known thermal interface fluids may be employed, including, for example: water (5° C. to 85° C.), water and propylene glycol (−20° C. to 110° C.), alcohol (−10° C. to 85° C.), SOLVAY SOLEXIS ZT130 (−65° C. to 85° C.), FLOURINERT™ FC-77 (−65° C. to 85° C.), and HFE 7500 (manufactured by 3M™, −65° C. to 85° C.). In a preferred embodiment, dielectric fluid is used as the fluid in the device, and the pressure of the fluid in the interstice 120 may range from −20 kiloPascals (kPa) to −60 kPa. This reduced pressure maintains the suction between the wafer 100 and the chuck 110, such that the wafer 100 is held in place for testing. It is noted that other pressures and temperatures are also contemplated, and that the above ranges are but one exemplary embodiment.

As is shown in FIG. 1, the interstice 120 is not closed at the edge of the wafer 100 or chuck 110. The fluid, though, does not escape at the edge of the wafer 100 or chuck 110 at least because the fluid in the interstice 120 is at a pressure lower than that of the atmosphere surrounding the device. Moreover, it will be understood by those of skill in the art that both the surface of the wafer 100 and the surface of the chuck 110 are highly polished, such that the distance between the wafer 100 and the chuck 110 is on the order of one micron. Therefore, to the extent that there is not a perfect seal at the edge of the wafer 100 and chuck 110, minimal air may enter the device or system and travel in the fluid, but the fluid is substantially contained within the device or system and does not substantially escape at this edge.

During operation of the device, the fluid flows in the interstice 120, between the wafer 100 and the chuck 110, to an outlet 130. The outlet 130 is effectively a hole in the chuck 110. Although FIG. 1 shows only one outlet 130, it will be understood by those of skill in the art that there may be more than one outlet 130. Additionally, it will be appreciated by those of skill in the art that these outlets 130 may be configured on the face of the chuck 110 in any one of various arrangements, for example the outlets 130 may form the shape of concentric rings on the face of the chuck, or may be randomly distributed thereon. And, one of skill in the art will understand that the face of the chuck 130 may include grooves in which the fluid flows.

From the outlet 130, the fluid flows into a return line 140. In alternate embodiments, multiple outlets 130 may flow into one or more return lines 140. The pressure of the fluid in the interstice 120 may be controlled by a first pressure regulator and/or valve 145 in the return line 140.

The return line 140 carries the fluid through the chuck 110 to a pump 150. The pump increases the pressure of the fluid. By the action of the pump, fluid that is downstream from the pump is at a higher pressure, and fluid that is upstream from the pump is at a lower pressure. Such increased pressure has the effect that, if any of the fluid vaporized while under reduced pressure or increased temperature, that fluid is recondensed into its liquid phase. From the pump 150, the fluid travels to a reservoir 160.

In a preferred embodiment, the reservoir 160 may cool the fluid via a cooler 160a to further precipitate the fluid's shift from the vapor to the liquid phase. Optionally, the cooler 160a may be eliminated, depending on the pressure and type of fluid. Optionally, the pressure in the reservoir 160 may be controlled by a second pressure regulator and/or valve 165, which is preferably positioned on the reservoir such that it releases only air, while the fluid in its liquid form remains in the reservoir. Also optionally, this second pressure regulator and/or valve 165 may be connected to an exhaust line 170, such that any harmful vapors may be captured.

In a further alternative embodiment, the reservoir 160 may be equipped with a fluid access port 180 such that fluid may be added to or removed from the system. The fluid access port 180 may be controlled by a third pressure regulator and/or valve 175.

From the reservoir 160, the fluid travels through a supply line 190. Optionally, foreign particles may be removed from the fluid by a filter 200 along the supply line 190 or the return line 140. During the fluid's travel in the supply line 190, the pressure of the fluid is reduced. This may be accomplished by any of several known methods. For example, a fourth pressure regulator and/or valve 195 may be employed on the supply line, or the diameter of the supply line may be reduced such that the resistance in the supply line 190 causes the pressure to drop.

In an alternative embodiment, an air supply line 210, including a fifth pressure regulator and/or valve 205 may supply air to the supply line 190. In this alternative embodiment, after completion of testing and/or burn-in, the fluid may be cleared from the interstice 120. The wafer 100 is thus more easily removed from the chuck 110. Moreover, the fluid in the interstice 120 is recovered and not released.

The supply line 190 travels through the chuck 110, and delivers the fluid back to the interstice 120 through an inlet 220. Although FIG. 1 shows only one supply line 190 and one inlet 220, it will be understood by those of skill in the art that there may be more than one supply line 190 and more than one inlet 220. Additionally, it will be appreciated by those of skill in the art that these inlets 220 may be configured on the face of the chuck 110 in any one of various arrangements, for example the inlets 220 may form the shape of concentric rings on the face of the chuck, or may be randomly distributed thereon. As discussed above, one of skill in the art will understand that the face of the chuck 130 may include grooves in which the fluid flows. From the inlet 220, the fluid flows in the interstice 120, conducting heat between the wafer 100 and chuck 110, and then travels again, as discussed above, to an outlet 130. Thus, the system and method of the present invention is a substantially closed-loop system.

The advantages of the continuous fluid recovery in the present invention include a substantial reduction in costs of operation. For example, in a prior art method employing a thermal interface fluid, more than 2-4 milliliters per hour may have been diffused and lost from the system. For example, at present, the thermal interface fluid GALDEN® HT-110 costs approximately $450 per gallon. In a factory running twenty tools, the cost savings of preventing the above loss may amount to as much as $650,000 per year. Additional cost savings include a reduction of the facilities exhaust scrubber costs, and the lower cost of maintenance of the simpler design of the present invention. A further advantage is in improved safety and a reduction in environmental concerns. Additionally, the method of the present invention enables better thermal performance at a wider range of fluid pressures within the interstice 120.

As will be understood by one of skill in the art, the temperature of the chuck 110 itself may be regulated by a second fluid. In this case, the chuck may include channels for circulating a second temperature controlling fluid. This second fluid cools or heats the chuck 110 by convection. Such regulation of the chuck 110 by channels and/or a manifold are well understood in the art, and are therefore not shown in the figures. The chuck may also contain heating or thermoelectric elements and temperature sensors as is well known in the art.

The present invention would be useful in other situations in which a heat sink is placed in contact with a product or device under test where the test is conducted in a vacuum, and the temperature must be controlled. Specifically, after wafers are tested, they are diced, mounted, and tested again at the module level. During such testing, the temperature must likewise be controlled for many of the same reasons discussed herein.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

What is claimed is:

1. A method comprising:
   circulating a heat transferring fluid in a substantially closed loop system, including in an interstice between a wafer and a chuck at a first pressure that is lower than that of atmosphere surrounding the wafer and the chuck;
   pumping the fluid out of the interstice and increasing the pressure of the fluid to a second pressure; and
   reducing the pressure of the fluid to the first pressure and returning the fluid to the interstice.

2. The method of claim 1, wherein the first pressure is lower than a pressure surrounding the wafer and the chuck.

3. The method of claim 1, wherein the second pressure is sufficient to condense any vaporized fluid.

4. The method of claim 1, further comprising filtering the fluid.

5. The method of claim 1, further comprising cooling the fluid while it is at the second pressure.

6. The method of claim 5, wherein the fluid is cooled to a temperature sufficient to condense any vaporized fluid.

7. The method of claim 1, further comprising regulating the fluid pressure between higher pressure and lower pressure steps.

8. The method of claim 1, further comprising purging the fluid contained within the substantially closed loop system.

9. The method of claim 1, further comprising carrying the fluid from the interstice through the chuck and to a pump.

10. The method of claim 9, wherein a pressure of the fluid is increased by the pump such that the fluid downstream from the pump is at a higher pressure then the fluid at the interstice.

11. The method of claim 10, wherein the fluid is re-condensed into its liquid phase by the increased pressure.

12. The method of claim 11, further comprising traveling the fluid from the pump to a reservoir.

13. The method of claim 12, further comprising cooling the fluid in the reservoir by use of a cooler.

14. The method of claim 13, wherein the cooling of the fluid further precipitates the fluid's shift from vapor to the liquid phase.

15. The method of claim 13, wherein the pressure of the fluid in the reservoir is regulated by a pressure regulator.

16. The method of claim 13, wherein the pressure of the fluid in the reservoir is regulated by a valve which releases only air, while the fluid in its liquid form remains in the reservoir.

17. The method of claim 16, further comprising adding or removing the fluid into the reservoir through a fluid access port.

18. The method of claim 12, wherein the fluid is filtered after it leaves the reservoir, along a supply line.

19. The method of claim 18, wherein the reducing the pressure occurs in the supply line, after it leaves the reservoir.

20. The method of claim 19, wherein the pressure is reduced by at least one of a pressure regulator and valve employed on the supply line.

21. The method of claim 19, wherein the pressure is reduced by reducing a diameter of the supply line.

22. The method of claim 19, further comprising clearing the fluid from the interstice after completion of testing and/or burn-in.

23. The method of claim 19, further comprising regulating a temperature of the chuck with a second temperature controlling fluid by convection.

24. The method of claim 1, further comprising regulating a temperature of the chuck with a second temperature controlling fluid by convection.

25. A method comprising:
   circulating a heat transferring fluid within an interstice formed between a wafer and a chuck at a first pressure that is lower than that of atmosphere surrounding the wafer and the chuck;
   pumping the fluid out of the interstice, through the chuck and into a reservoir, while increasing the pressure of the heat transferring fluid to a second pressure higher than the first pressure;
   cooling the heat transferring fluid in the reservoir, while it is at the second pressure, so that the heat transferring fluid condenses into its liquid phase;
   regulating the pressure of the heat transferring fluid in the reservoir;
   filtering the heat transferring fluid after it leaves the reservoir, along a supply line;
   reducing the pressure of the heat transferring fluid to the first pressure and returning the fluid to the interstice;
   clearing the fluid from the interstice after completion of testing and/or burn-in; and
   regulating a temperature of the chuck with a second temperature controlling fluid by convection.

* * * * *